United States Patent [19]

Ochiai et al.

[11] Patent Number: 5,437,762
[45] Date of Patent: Aug. 1, 1995

[54] METHOD AND APPARATUS FOR SEMICONDUCTOR MEMORY

[75] Inventors: Akihiko Ochiai; Makoto Hashimoto; Takeshi Matsushita; Machio Yamagishi; Hiroshi Sato; Muneharu Shimanoe, all of Kanagawa, Japan

[73] Assignee: Siemens Aktiengesellschaft, Munich, Germany

[21] Appl. No.: 274,587

[22] Filed: Jul. 13, 1994

Related U.S. Application Data

[63] Continuation of Ser. No. 960,822, Oct. 14, 1992, abandoned.

[30] Foreign Application Priority Data

| Oct. 16, 1991 | [JP] | Japan | 3-296241 |
| Oct. 31, 1991 | [JP] | Japan | 3-313701 |
| Oct. 31, 1991 | [JP] | Japan | 3-313764 |

[51] Int. Cl.⁶ ............................................. H01L 21/306
[52] U.S. Cl. ................................... 216/20; 437/62; 437/974; 148/DIG. 12; 148/DIG. 135; 216/52; 216/99
[58] Field of Search ............................ 437/62, 974; 148/DIG. 12, DIG. 135

[56] References Cited

U.S. PATENT DOCUMENTS

| 4,601,779 | 7/1986 | Abernathey et al. | 437/974 |
| 5,013,681 | 5/1991 | Godbey et al. | 437/974 |
| 5,024,723 | 6/1991 | Goesele et al. | 156/630 |
| 5,091,330 | 2/1992 | Cambou et al. | 437/62 |
| 5,147,808 | 9/1992 | Pronko | 437/974 |

FOREIGN PATENT DOCUMENTS

| 0236676 | 1/1987 | European Pat. Off. | |
| 00189939 | 2/1983 | Japan | 437/62 |
| 0223344 | 12/1983 | Japan | 437/62 |
| 0289124 | 11/1989 | Japan | 437/62 |
| 0257652 | 10/1990 | Japan | 437/62 |

OTHER PUBLICATIONS

D. J. Godbey, et al, *Journal of the Electrochemical Society*, vol. 137, No. 10, pp. 3219–3223, Oct. 1990, "Fabrication of Bond and Etch-Back Silicon on Insulator Using a Strained SiGe Layer As an Etch Stop".

W. P. Maszara, et al, *Journal of Applied Physics*, vol. 64 No. 10, pp. 4943–4950, Nov. 1988, "Bonding of Silicon Wafers for Silicon-on-Insulator".

M. Hashimoto, et al, *Extended Abstracts of the 21st Conference on Solid State Devices and Materials*, 58–30 Aug. 1989, pp. 89–92, "Low Leakage SOIMOSFETs Fabricated Using a Wafer Bonding Method".

R. P. Vollertsen, et al, *Journal of the Electrochemical Society*, vol. 137, No. 12, pp. 3942–3947, Dec. 1990, "Reliability of 10nm Stacked Insulator on Polycrystalline Silicon in Planar and Trench Capacitors".

*Patent Abstracts of Japan*, Vol. 11, No. 55 (E-481)(2502) 20 Feb. 1987, JP-A-61 216 340 (Nec Kansai, Ltd.) 26 Sep. 1986, "Manufacture of Simiconductor Device".

Primary Examiner—Brian E. Hearn
Assistant Examiner—Trung Dang
Attorney, Agent, or Firm—Hill, Steadman & Simpson

[57] ABSTRACT

The invention concerns a method of forming various kinds of SOI structures and semiconductor memory devices using the forming technique. It is useful, for example, in SRAM or EEPROM devices. In EEPROM, it relates, in particular, to a method of manufacturing a non-volatile memory device in which a control gate electrode layer is laminated by way of an insulator film on a floating gate electrode layer. It includes a method of manufacturing a structure via the steps of forming an etching stopping layer on the surface of a silicon substrate, forming an epitaxially grown silicon layer on said etching stopping layer, bonding said silicon substrate formed with said silicon layer with another substrate as the insulator substrate, grinding said silicon substrate from the rear face and etching it until said etching stopping layer is exposed and removing said etching stopper layer, with or without polishing the other surface of said silicon substrate.

9 Claims, 12 Drawing Sheets

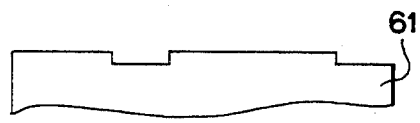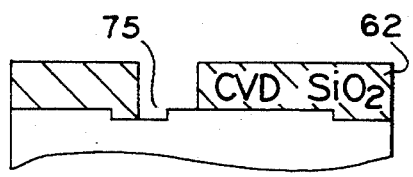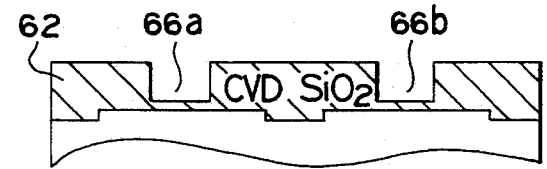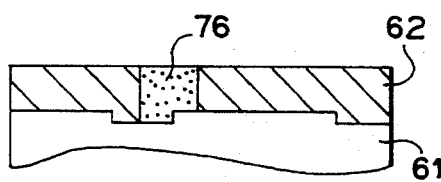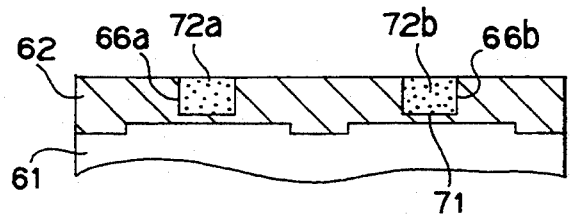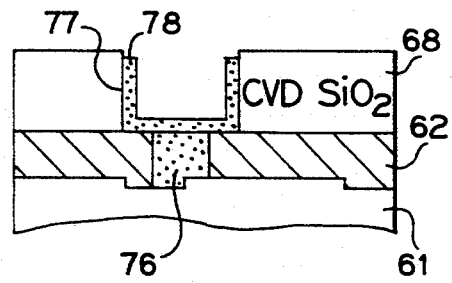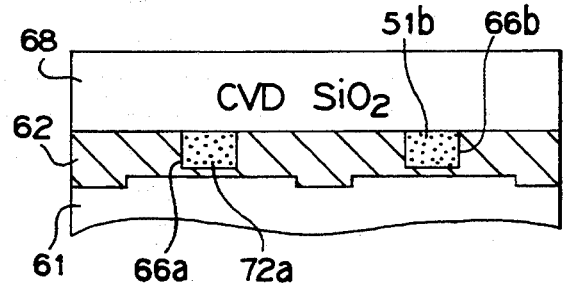

METHOD AND APPARATUS FOR SEMICONDUCTOR MEMORY

This is a continuation of application Ser. No. 07/960,822 filed Oct. 14, 1992 now abandoned.

BACKGROUND OF THE INVENTION

1. Field of the Invention

The present invention concerns a method of forming an SOI structure and a semiconductor memory device using the forming technique. SOI has been used as a structure for electronic parts such as semiconductor devices and the present invention can be utilized as a method of forming various kinds of SOI structures.

More specifically, it can be used, for example, to SRAM or EEPROM. In EEPROM, it relates, in particular, to a method of manufacturing a non-volatile memory device in which a control gate electrode layer is laminated by way of an insulator film on a floating gate electrode layer.

2. Description of the Prior Art

The SOI (silicon on insulator) structure has been utilized mainly in the field of electronic materials by a method of forming various kinds of semiconductor devices to a silicon portion disposed on an insulator layer.

As one of means for forming the SOI structure, it has been known a technique for bonding a substrate to another silicon substrate formed with an insulator portion on the side of the insulator portion and polishing the silicon substrate thereby providing a structure in which the silicon portion is present on the insulator portion. It is generally referred to as a bonded SOI or the like.

Since the bonded polished type SOI structure and a process therefor enables high integration of electronic materials and makes it possible to assemble devices above and below the silicon portion, it contributes to increase of the integration degree of IC or the like.

Description will now be made to a method of forming the bonded SOI structure with reference to FIG. 1-A to FIG. 1-G (refer to M. Hashimoto et. al. "Low Leakage SOIMOSFETs Fabricated Using a Wafer Bonding Method" in Extended Abstracts of the 21st Conference on Solid State Devices and Material 15, Tokyo, 1989, pp. 89–92 n).

As shown in FIG. 1-A, one surface of a silicon substrate 1 (highly flattened silicon wafer is generally used and referred to as a substrate A) is patterned by using photolithography or etching technology to form a recess at a depth of 1500 A or smaller.

Then, an insulator portion 2 is formed by forming an $SiO_2$ film on the surface by means of CVD or the like. Thus, a structure in which the insulator portion 2 is formed on one side of the silicon substrate 1 is obtained as shown in FIG. 1-B. The insulator portion 2 is formed as a film having unevenness as illustrated in the figure in accordance with the surface shape of the patterned silicon substrate 1.

Further, a polysilicon film 3 is formed to a thickness of about 5 um on the insulator portion 2, for example, by CVD. Thus the structure shown in FIG. 1-C is obtained. The polysilicon film 3 is provided for forming a highly smooth bonding surface upon bonding a separate substrate 4 (substrate 4 shown in B in FIG. 1-E) in the subsequent step.

Then, the surface of the polysilicon film 3 is polished to flatten, to attain a highly smooth surface. In this case, the thickness of the polysilicon film 3 as a remaining film is made to a thickness of 3 um or less.

Another substrate 4 (hereinafter referred to as substrate B) is brought into a close contact with the polished surface of the polysilicon film 3. Both of the surfaces are joined in close pressure bonding to obtain a joined structure as shown in FIG. 1-E. It is generally said that firm joining is attained due to hydrogen bonds present between both of the surfaces. Usually, they are thermally joined by heating to attain an extremely firm bonding. The bonding strength is generally greater than 200 kg/$cm^2$ and, sometimes, reaches as great as 2000 kg/$cm^2$. As another substrate 4 (substrate B) to be bonded, the same silicon substrate as the substrate 1 (substrate A) is usually employed, because a failure may be caused unless physical property such as thermal expansion coefficient is equal between them since they are often put to a heating step subsequent to the bonding. If there is no such problem, another substrate 4 is not necessarily a silicon substrate since this functions only as a support bed in the prior art, for example, shown in the drawing. However, in a case of forming a device also on the another substrate 4 (substrate B) to be appended, it has to be a semiconductor substrate capable of forming a device.

Then, the substrate 1 is ground so as to leave a silicon portion of the substrate 1 to about 5 um or less as the remaining film to attain a structure shown in FIG. 1-F. FIG. 1-F is turned from state in FIG. 1-E, because the structure is turned upside to down to situate the substrate 1 above for this grinding or for the subsequent selective polishing.

Then, selective polishing is applied. In this case, polishing of precious finishing is applied till the insulator portion 2 is just exposed. This provides a structure as shown in FIG. 1-G in which a silicon portion 10 is present on the insulator portion 2 being surrounded with undulating insulator portion 2. The silicon portion 10 forms a SOI film. To a structure in which the silicon portion 10 is present on the insulator portion 2 (SOI structure), various kinds of devices are formed to the silicon portion 10 (SOI film). As shown in FIG. 1-G, since each of the silicon portions 10 is surrounded with the insulator portion 2, a structure in which device isolation is attained from the first is provided.

Further, in a method of manufacturing the SOI substrate as described above, since the film thickness 10 in FIG. 1-G varies within a wafer surface, the thickness of an inland single crystal silicon thin film formed to or required pattern also varies.

Further, selective polishing is applied till the boundary between the silicon wafer and the silicon oxide film is exposed in order to obtain a required pattern for the single crystal silicon thin film. In this case, since an over polishing is required to some extent, the surface of silicon is exposed to an alkaline polishing solution for a long period of time, to roughen the silicon surface. If a TFT (thin film transistor) is formed on the roughened silicon surface, a device with good characteristics can not be obtained since the reliability of a gate insulator film is lowered.

Further, in the SOI process utilizing the bonding polishing method as described above or an electrostatic pressure bonding method, since various kinds of devices can be assembled to the surface and the rear face of the SOI portion (the silicon portion 10 in FIG. 1-G), the mounting density can be increased. By adopting this technology, the size of a memory cell, for example, DRAM can be reduced. However, although the density of a circuit such as a memory cell has been intended to increase in the prior art, the merit of this technique is not effectively utilized for peripheral circuits. For instance, referring to a memory device such as a DRAM or SRAM, although it has been considered to reduce the size of the memory cell by using the SOI technology, the SOI technology is not always utilized for other peripheral circuits and, for example, it has not been conducted to increase the density for the transistor as the peripheral circuit, thereby improving the performance (for example, increasing the operation speed).

Further, for the method of forming a memory device such as EEROM, electric characteristics can be improved outstandingly by applying the polishing method used for SOI.

That is, as shown in FIG. 2, when a floating gate electrode layer is formed, the surface is not flattened but pointed protrusions 25 are formed. Then, an electric field is concentrated to a portion where the protrusions 15 are present in this structure.

Accordingly, in a second gate insulator film between the floating gate electrode 13 and the control gate electrode 14, there is a portion where the thickness is decreased by the protrusions 15. If LSI is manufactured in such a state and applied with a voltage, the electric field is concentrated to a portion where the protrusions 15 are present. Then, electrons in the floating gate electrode are extracted by the electric field applied to the control gate electrode due to the concentration of the electric field, to result in signal data possessing characteristic, thereby bringing about a problem incapable of maintaining the threshold value of a memory transistor at a high level.

OBJECTS AND SUMMARY OF THE INVENTION

A first object of the present invention is to provide a method of manufacturing a SOI substrate capable of improving the uniformity at the surface of a polished silicon layer.

A second object of the present invention is to attain mounting at a further increased density by using the SOI technique and provide a method of forming a SOI structure that effectively utilizes the merit of the SOI technique, for example, also in peripheral circuits.

A third object of the present invention is to provide a method of manufacturing a non-volatile semiconductor memory capable of preventing the data possessing characteristics from lowering and maintaining a threshold level of a memory transistor at a high level in a memory device such as EEPROM using the technique used for the formation of SOI.

DESCRIPTION OF THE PREFERRED EMBODIMENT

Figure 1A:
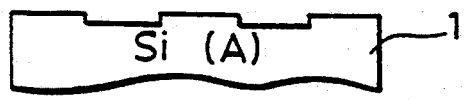
FIG. 1-A through FIG. 1-G show a conventional method of manufacturing bonding type SOI.
Figure 1B:
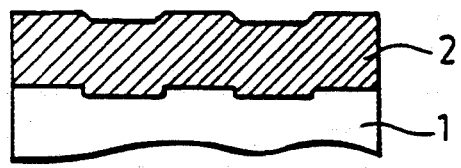
Figure 1C:
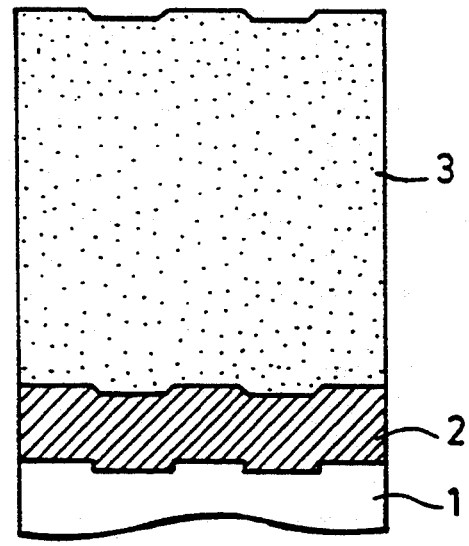
Figure 1D:
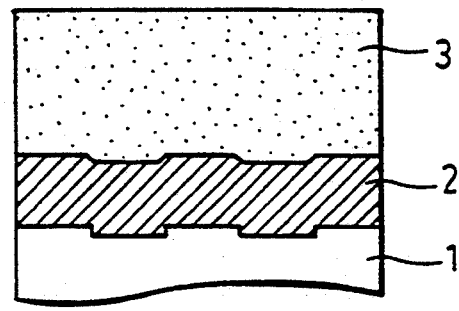
Figure 1E:
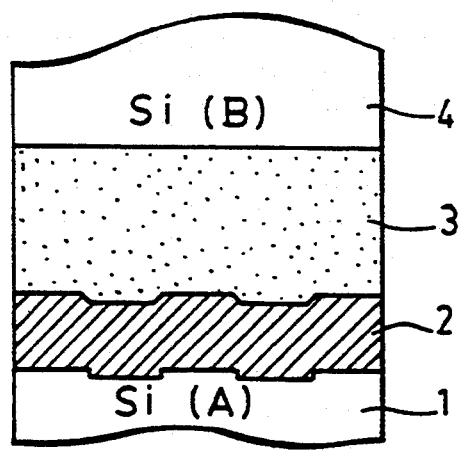
Figure 1F:
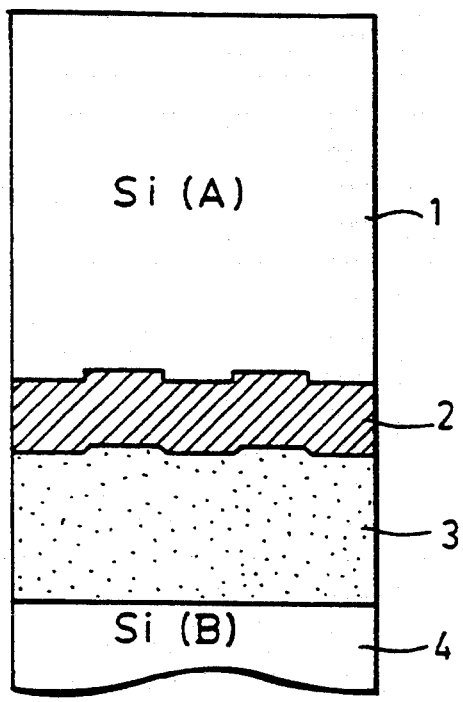
Figure 1G:
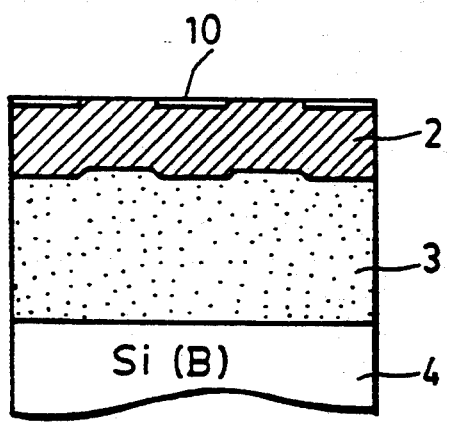

Descriptions will now be made to preferred examples according to the present invention with reference to the drawings.

The first example of the present invention will now be described.

This example concerns a method of manufacturing a SOI substrate by bonding a pair of silicon wafers, in particular, a method of forming a $p^+$ type impurity layer as an etching stopping layer. This example will now be described in accordance with the steps with reference of FIG. 3-A through FIG. 3-E.

At first, a $p^+$ type impurity layer 22 is formed to a thickness x on the surface of a (100) face of a $p^-$ type single crystal silicon substrate 1. The $p^+$ type impurity layer 22 functions as an etching stopping layer. The $p^+$ type impurity layer 22 is formed, for example, by introducing impurities such as boron to the surface of the silicon substrate 21 by means of ion implantation or thermal diffusion. The impurity concentration of the $p^+$ type impurity layer 22 is about $10^{20}$ cm$^{-3}$, while the impurity concentration of the $p^-$ type silicon substrate 21 is about $10^{14}$ cm$^{-3}$. Since the silicon substrate 21 is mirror finished from the first, the thickness x of the $p^+$ type impurity layer 22 less varies as well.

Then, as shown in FIG. 3-A, a $p^-$ type silicon layer 23 is formed, by means of epitaxial growing, to the surface of the silicon substrate 21 formed with the $p^+$ type impurity layer 22. Since this is formed by the epitaxial growing, the silicon layer 23 comprises single crystals conforming the crystallinity of the substrate.

After forming the silicon layer 23 as the epitaxially grown layer, a step 24 along with the inland pattern to be formed to the surface 23a of the silicon layer 23 is formed. The height of the step 24 corresponds to the thickness of the single crystal silicon thin film to be formed. After forming the step 24, a silicon oxide film 25 is deposited over the entire surface as shown in FIG. 3-B.

Another silicon substrate 26 is provided and, as shown in FIG. 3-C, bonded with the silicon substrate 21 to which the silicon oxide film 25 is deposited to the surface by way of a polysilicon layer 27 in accordance with an ordinary bonding method. It is preferred to set the thickness of the silicon layer 23 such that impurities of the $p^+$ type impurity layer 22 do not diffuse to the bottom 24a of the step 24 by the heat treatment till the bonding stage.

Then, grinding is applied from the rear face of the silicon substrate 21 to such an extent as not expose the $p^+$ type impurity layer 22 as the etching stopping layer, to reduce the thickness of the silicon substrate 21. After the grinding, the silicon substrate 21 is eliminated by etching using the difference of the impurity concentration till the $p^+$ impurity layer 22 appears. The etching is applied by using a solution mixture of ethylene diamine—pyrocatechol—purified water. When the etching rate for the $p^+$ type impurity layer, relative to the (100) face silicon is set as 1, the etching rate for the $p^-$ type silicon substrate 21 is 400, so that etching at an extremely high selection ratio is applied. Since the $p^+$ type impurity layer 22 of high uniformity has already been formed by utilizing the already mirror finished silicon substrate 21, etching is stopped at a state where the difference of the film thickness is extremely small as shown in FIG. 3-D reflecting the p+ type impurity layer 22.

Since the etching speed ratio is 400:1, it may suffice that the film thickness x of the p+ type impurity layer 22 is at least more than 1/400 of the distance z from the surface of the p+ type impurity layer 22 to the bottom 24a of the step 24.

After stopping etching with a good uniformity at the surface of the p+ type impurity 22, the p+ type impurity layer 22 and the silicon layer 23 formed by epitaxial growing are ground by selective grinding. In this case, since the variation within the plane at the surface of the p+ type impurity layer 22 is suppressed, a single crystal silicon thin film of excellent uniformity is formed also for the exposed surface 23b of the silicon layer 23 obtained by the selective polishing.

As has been described above, in the method of manufacturing the SOI substrate according to this example, since the etching is stopped at the uniform surface by the p+ type impurity layer 22 as described above, variation for the thickness of the single crystal silicon thin film in the inland region is suppressed even after the selective polishing. Further, since this is excellent in uniformity, an excess polishing is no more required, so that the exposed surface 23b of the silicon layer 23 is not exposed to an alkaline polishing solution for a long period of time. Accordingly, the reliability of the SOI device is also improved.

In the method of manufacturing the SOI substrate in accordance with the present invention, the etching stopping layer is formed uniformly on the surface of the silicon substrate, and etching from the rear face of the silicon substrate after bonding can be stopped while reflecting the uniformity thereof. Accordingly, it is excellent in the uniform thickness of the single crystal silicon thin film to save the time required for selective polishing. Accordingly, the reliability of the device formed on the SOI substrate can be improved remarkably by applying the method of manufacturing the SOI substrate according to the present invention.

Descriptions will now be made to a second example according to the present invention with reference to FIG. 4-A through FIG. 4-F.

As shown in FIG. 4-A, one of the surfaces of a silicon substrate 31 is patterned.

Then, an insulator portion 32 is formed and the first conductive portions 43a, 43b (a first gate electrode in this example) are formed at one position on the surface of the silicon substrate 31 formed with the insulator portion 32, that is, at a position to form a transistor as a peripheral circuit in this example, to provide a structure as shown in FIG. 4-B.

Then, a connection hole 44 is formed to define a filled connection portion 45 at the other position on the same surface of the silicon substrate 31, that is, at a position to form a cell portion of a semiconductor memory device such as DRAM in this example to provide a structure as shown in FIG. 4-C.

Then, a groove 46 is formed on the connection portion 45 and a trench function portion (a memory capacitor comprising a storage electrode 47 and a capacitor insulator film 48 in this illustrated example) is formed to provide a structure shown in FIG. 4-D.

Subsequently, a polysilicon film 33 is properly formed and polished (refer to FIG. 4-E) and with another substrate 52 is bonded. Although the substrate 52 is not particularly illustrated in FIG. 4, it is the same as that in the case of FIG. 1.

Further, the silicon substrate 31 is polished on the surface of the other side to form a silicon portion 40 and, subsequently, a second electroconductive portion (second gate electrodes 49a, 49b of the transistor on the side of the peripheral circuit and the second gate electrode 49c on the side of the cell as the word electrode) is formed on one and the other positions to form a SOI structure as shown in FIG. 4-F.

Specifically, this example comprises steps (1)-(7) described below as actual constitutions.

The process for the steps is shown successively.

(1) Silicon RIE is applied for forming inter-device isolation regions to the silicon substrate 31. The etching depth is set to about 100 nm or less. Thus, a structure shown in FIG. 4-A is obtained.

(2) An insulator portion 32 comprising $SiO_2$ is formed by surface oxidation. This also serves as a first gate insulator film 41 of the transistor in the peripheral circuit. Further, a first gate electrode as the first conduction portion 43a, 43b is formed with polysilicon or the like.

(3) An inter-layer film 50 is formed over the entire surface, for example, by $CVDSiO_2$. A contact as a connection hole 44 is perforated for leading out a storage electrode in the cell portion and filled with polysilicon to form a connection portion 45 (polysilicon plug). This can be obtained by entirely forming polysilicon and then etching back it. A structure shown in FIG. 4-C is thus obtained.

(4) Further, after depositing $SiO_2$ as an inter-layer film 51 by a CVD process, a groove 46 is formed to the cell portion as a groove for forming the storage electrode. After perforating the groove 46, polysilicon or the like is formed over the entire surface (refer to a portion shown by the dotted line in FIG. 4-D) and, subsequently, etched back to form a storage electrode 47.

(5) A capacitor insulator film 48 is formed by using a silicon nitride film or the like. A structure shown in FIG. 4-D is obtained.

(6) Then, a plate electrode 33 is formed, for example, with polysilicon and the surface is flattened by grinding. A structure as shown in 1-E is thus obtained.

(7) Polished surfaces of the support substrate 52 (not illustrated) and the plate electrode 33 are adhered by a bonding or electrostatic press bonding process to conduct bonding. Then, the silicon substrate 31 on the side of the device is ground using $SiO_2$ as the insulator portion 32 as a stopper. Further, the surface is oxidized to form a $SiO_2$ film 42. Second conduction portions 49a, 49b, 49c are formed, for example, with polysilicon thereover to form a gate electrode. This constitute a word line (second conduction portion 49c) in the cell, and a second electrode (second conductive portions 49a, 49b) of the double gate in the peripheral circuit. The second electrode is previously connected with the first electrode by means of a contact hole.

Subsequently, by way of the same steps as those of various kinds of steps employed so far for forming the memory cell and the peripheral circuit thereof (source, drain injection or formation of aluminum wires), to form a semiconductor memory device.

According to this example, since the peripheral transistor circuit can also be constituted with the double gate, high speed performance of the peripheral circuit can also be realized.

Description will then be made to the third example according to the present invention.

FIG. 5 shows a process flow of this example. The method of forming the SOI structure in this example, comprises forming an insulator portion 62 on one side of a silicon substrate as shown in FIG. 5-B, bonding another substrate 80 on the side thereof formed with the insulator portion 62 (bonding on the upper surface in FIG. 5-E), and polishing the other side of the silicon substrate 61, thereby obtaining an SOI structure in which a silicon portion 70 is present on the insulator layer 62 as shown in FIG. 5-F. The method comprises each of the following steps.

One of the surfaces of the silicon substrate is patterned as shown in FIG. 5-A.

Then, the insulator portion 62 is formed on the patterned surface and, further, openings 66a, 66b at the positions on one side of the surface of the silicon substrate 61 formed with the insulator layer 62, that is, at the position to form a transistor as the peripheral circuit in this example, while a connection hole 75 is formed at the other position on the same surface of the silicon substrate 61, that is, at the position to form a cell portion of a semiconductor memory device such as DRAM in this example to attain a structure as shown in FIG. 5-D.

Then, the openings 66a, 66b are filled with polysilicon or the like to form first conduction portions 72a, 72b, that is, the conduction portions 72a, 72b as the first gate electrode of the peripheral transistor in this example. At the same time, the connection hole 75 is filled to form a connection portion 76 to attain a structure as shown in FIG. 5-C.

Then, a groove 77 is formed on the connection portion 76 and a trench function portion (same memory trench capacitor as in Example 2) to the groove 71 to attain a structure as shown in FIG. 5-D.

Subsequently, by way of the structure shown in FIG. 5-E in the same manner as in Example 2, another substrate (not illustrated) is bonded, the other surface of the silicon substrate 61 is polished to form a silicon portion 70 and then the same second conduction portions 74a-74c as in Example 1 are formed at one and the other positions to attain a SOI structure as shown in FIG. 5-F.

The method of forming the first conduction portions 72a, 72b (first electrode) in this example is different from that in Example 2, in which the conduction material (polysilicon) upon forming the polysilicon plug in the cell portion as the connection portion 76 is used also as the double gate first electrode of the peripheral transistor. The first gate oxide film 71 in the peripheral circuit is removed by etching using a diluted fluoric acid in the cell portion by using a resist mask in the step before FIG. 5-B to attain a structure as shown in FIG. 5-B. The subsequent steps are the same as those in Example 2.

The insulator portion 62 can be formed by applying CVD to SiO$_2$. Further, 68 in FIG. 5 denotes an interlayer film which in formed from SiO$_2$ by CVD or the like.

This example can also provide the same effect as that in Example 2.

Both in Examples 2 and 3, the first conduction portion is formed as the first electrode for constituting the double gate of the peripheral transistor of the memory device but the present invention is not restricted only thereto. For instance, the present invention is also applicable to the formation of a MOS transistor structure, in which the first conduction portion can be constituted as a connection wiring for connecting NMOS and PMOS. In addition, it can be used also for various kinds of other wiring structures.

As has been described above according to the present invention, further increased density can be attained by using the SOI technique. For instance, it can be embodied also in the peripheral circuit as a method of forming the SOI structure effectively utilizing the merit of the SOI technique.

Further, in the second and the third examples, the p$^+$ impurity layer 22 and the p$^-$ silicon layer 23 are formed on the p$^-$ silicon substrate 21 shown in the first example of the present invention and the silicon portion (SOI film) 70 in FIG. 4-F and the silicon portion (SOI film) 70 in FIG. 5-F can also be formed in the same manner at a high accuracy.

Description will then be made to a fourth example of the present invention.

At first, as shown in FIG. 6-A, a surface of silicon substrate 81 is oxidized to form a first gate insulator film 82 and then a pure polysilicon layer 83 not containing the impurity of first layer as the floating gate electrode layer is formed. When the first polysilicon layer 83 is formed, protrusions 86 are already formed as shown in FIG. 6-A. Subsequently, P (phosphorus) is diffused into the polysilicon layer 83 in order to make the floating gate electrode layer electroconductive.

Figure 2:
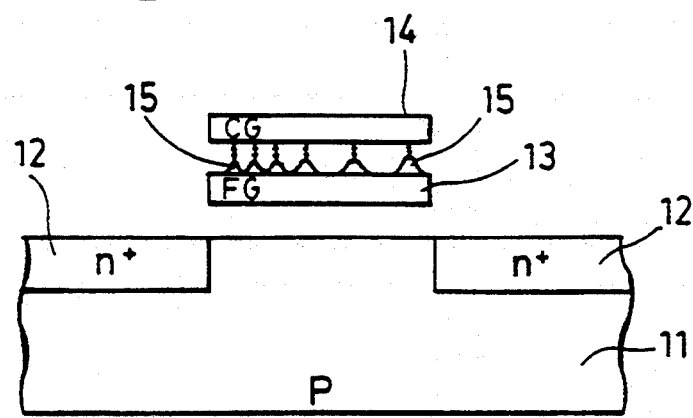
FIG. 2 shows a structural view of a conventional EEPROM.
Figure 3A:
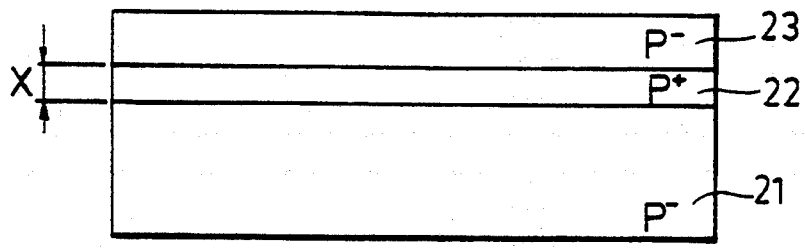
FIG. 3-A through FIG. 3-E show a process for producing a semiconductor device of a SOI structure as a first example according to the present invention.
Figure 3B:
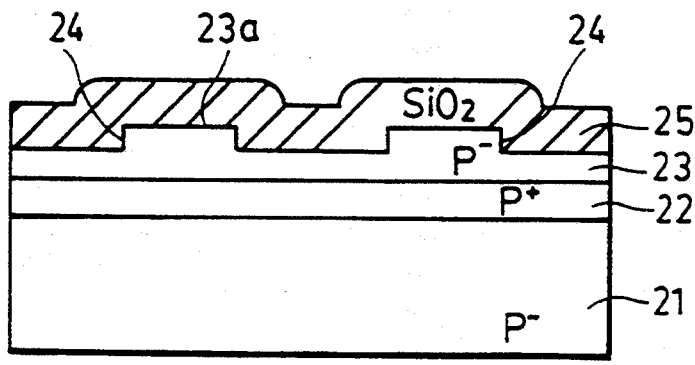
Figure 3C:
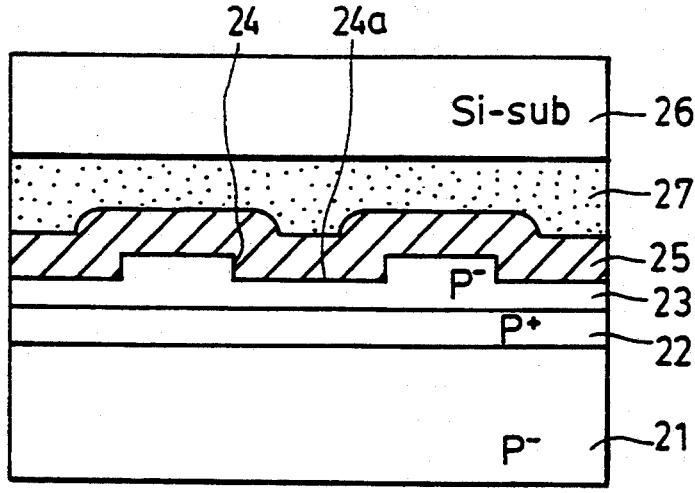
Figure 3D:
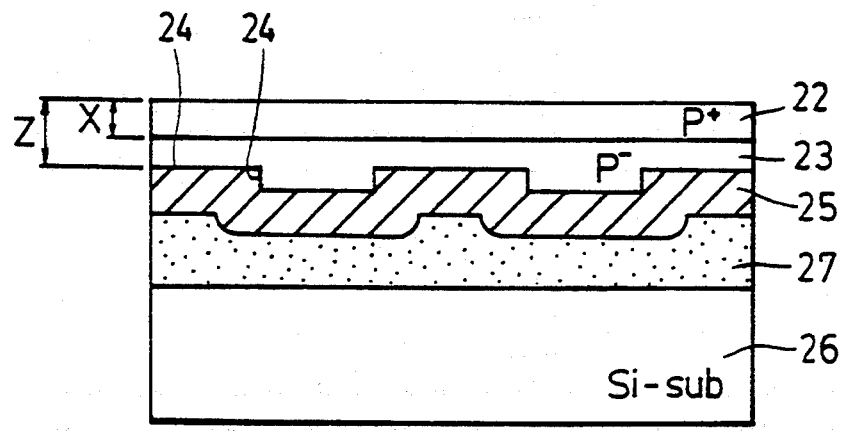
Figure 3E:
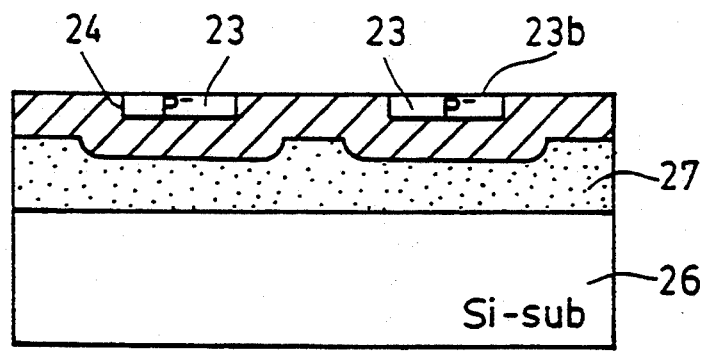
Figure 4A:
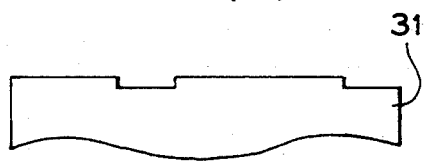
FIG. 4-A through FIG. 4-L show a process for producing a semiconductor device of a SOI structure as a second example according to the present invention.
Figure 4G:
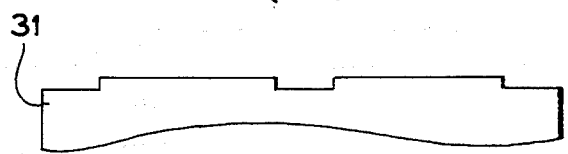
Figure 4B:
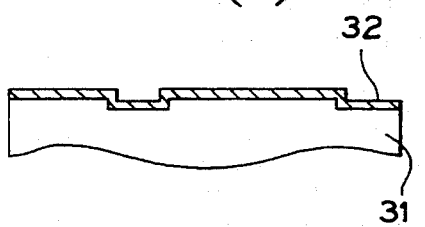
Figure 4H:
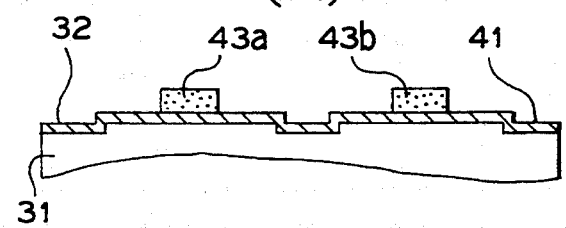
Figure 4C:
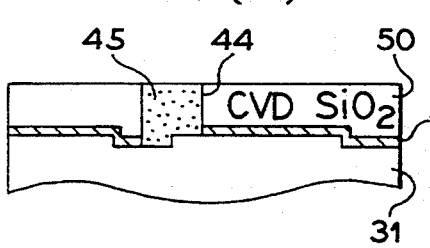
Figure 4I:
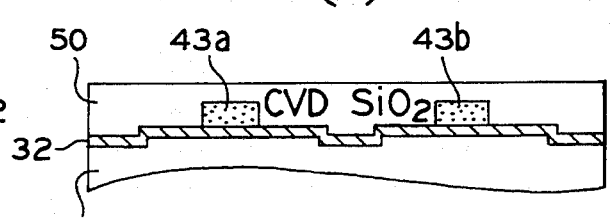
Figure 4D:
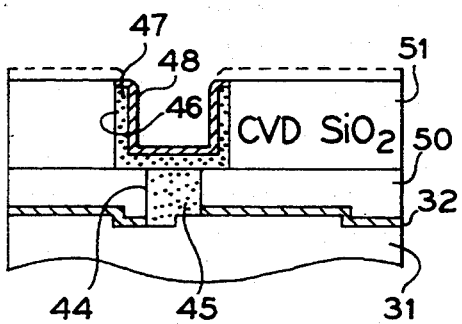
Figure 4J:
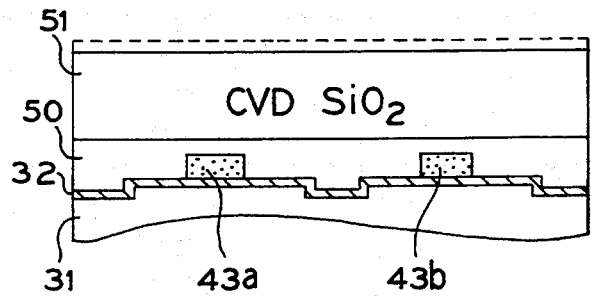
Figure 4E:
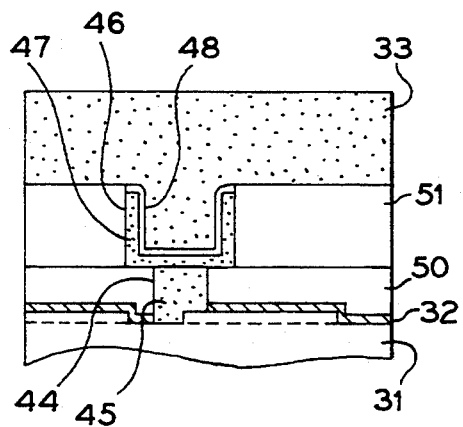
Figure 4K:
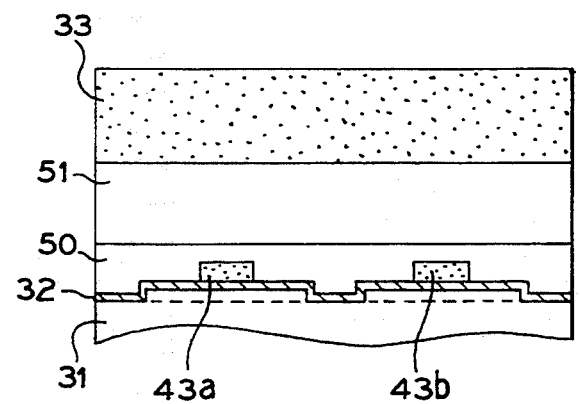
Figure 4F:
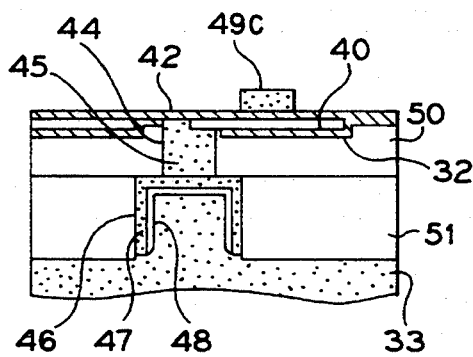
Figure 4L:
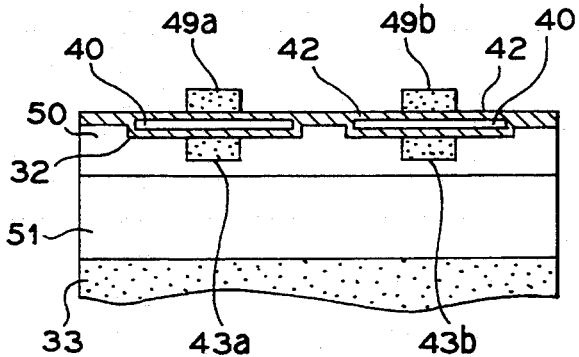
Figure 5E:
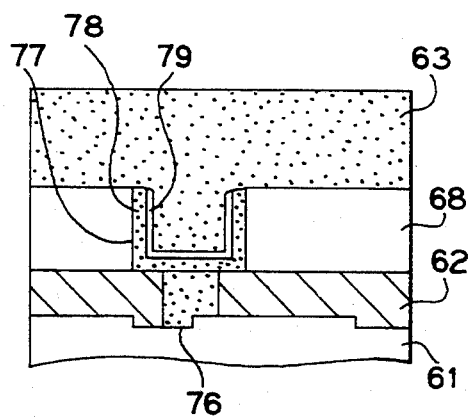
FIG. 5-A through FIG. 5-L show a process for producing a semiconductor device of a SOI structure as a third example according to the present invention.
Figure 5K:
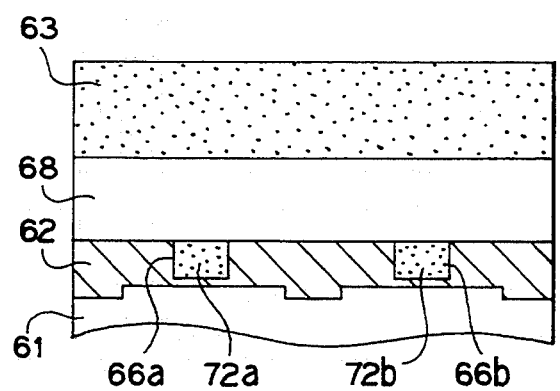
Figure 5F:
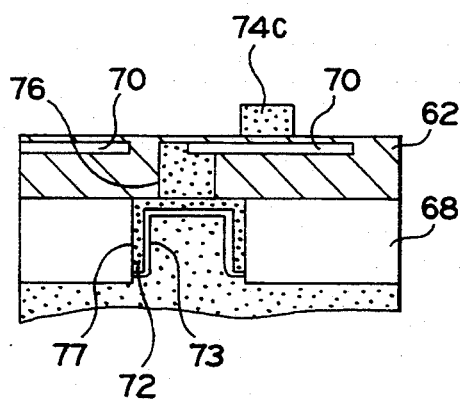
Figure 5L:
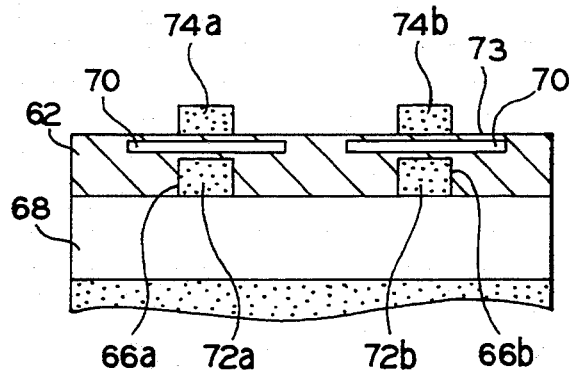
Figure 6A:
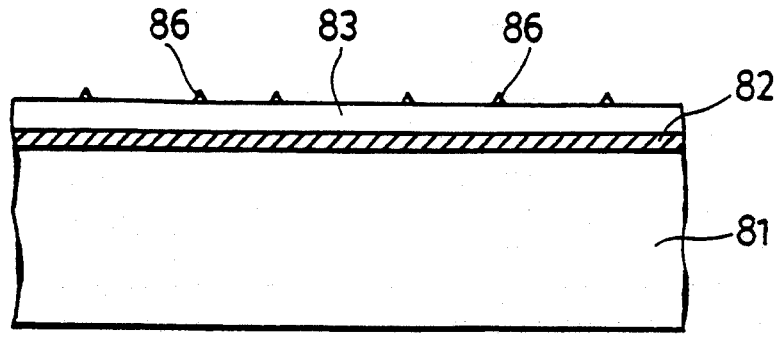
FIG. 6-A through FIG. 6-F show a process for producing a EEPROM device for fabricated by using the manufacturing process for the SOI device as a fourth example according to the present invention.
Figure 6B:
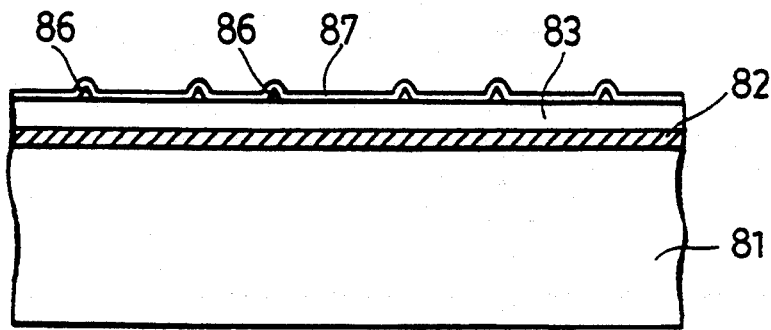
Figure 6C:
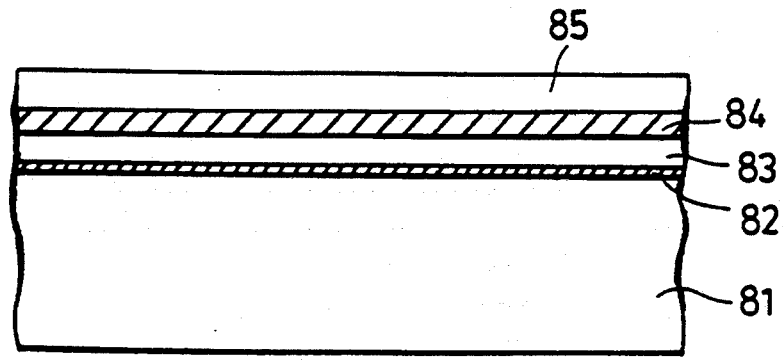
Figure 6D:
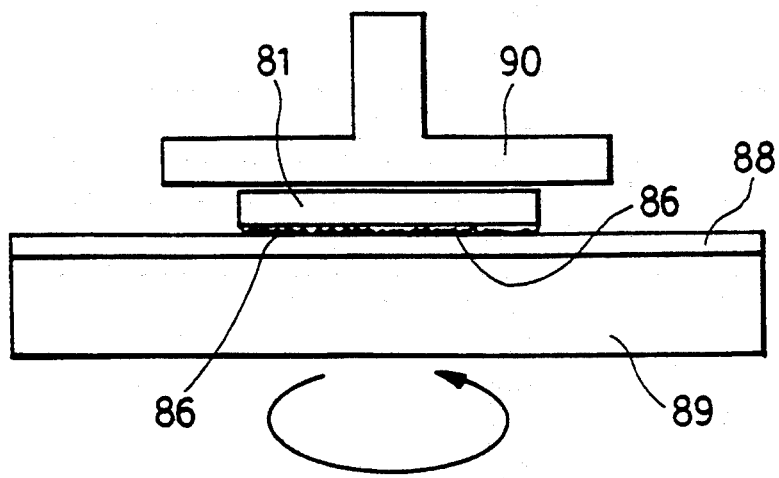
Figure 6E:
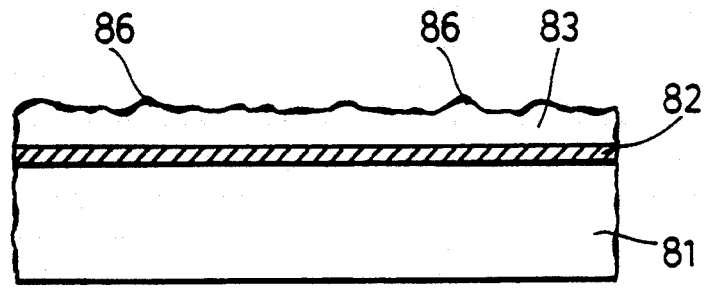
Figure 6F:
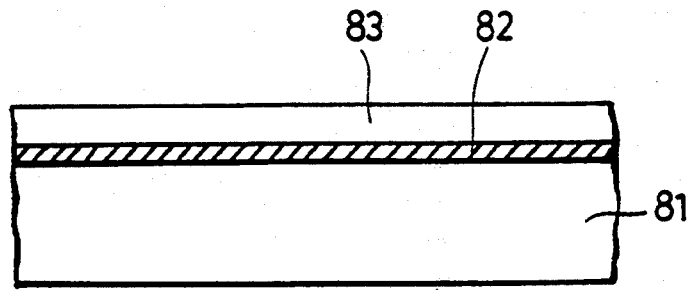

Then, a PSG (phosphorus glass) film 87 is formed, for example, by diffusion, in which the protrusions 86 are not removed but rather grown spontaneously further also on the PSG film 87 or the like as shown in FIG. 2, and the height of the protrusions 86 reaches as large as 500–1000 Å.

Then, the protrusions 86 are removed. The protrusions 86 are removed by etching the PSG (phosphorus glass) film 87 formed upon diffusion of P (phosphorus).

Then, before patterning the first polysilicon layer 83, the protrusions 86 grown as described above are polished by using the device to be described below.

The device used for polishing the protrusions 86 comprises, as shown in FIG. 6-D, an upper disc and a lower disc. The upper disc 90 is made of a ceramic plate and the lower disc 89 has a polishing cloth 88 bonded on the surface thereof. The polishing cloth 8 of the lower disc 89 is made of a soft polishing cloth (soft cloth).

A silicon substrate 81 in which the protrusions 86 are grown on the first polysilicon layer 83 is placed on the upper disc 90 of the ceramic plate, with the silicon substrate 81 being directed downward. Then, at least the lower disc 89 having the polishing cloth 88 is rotated.

In an experiment conducted by the present inventor, the circumferential speed of the disc was set to 50 m/sec and the pressure applied was set to 140 g/cm$^2$, respectively.

Then, a polishing solution was caused to flow on the polishing cloth 88 of the lower disc 89. The polishing solution was incorporated with an abrasive (a strong alkaline solution having colloidal silica dispersed therein) and the solution was caused to flow at a rate of 5 cc/min.

Under the condition as described above, the lower disc 89 was rotated to polish the protrusions 86 of the first polysilicon layer 83 as the floating gate electrode layer.

Then, as shown in FIG. 6-F, the surface was polished and the protrusion was removed to form a flattened first polysilicon layer 83. In this way, polishing was applied by the combination of chemical polishing using the abrasive and mechanical polishing using the polishing cloth and it was confirmed in the experimental example conducted by the present inventor that the surface of the first polysilicon layer 83 could be polished at a high accuracy.

Subsequently, a second polysilicon layer 85 for the control gate electrode layer was caused to grow by way of the second insulator film 84.

Then, as shown in FIG. 6-C, since the surface of the floating gate electrode layer 83 was already flattened, the thickness of the oxide film was not reduced locally in the second gate insulator film 84. Accordingly, voltage withstand of the floating gate electrode layer 83 and the control gate electrode layer 85 could be improved.

Then, when LSI was manufactured and a voltage was applied, there was no localized concentration of an electric film between the floating gate electrode layer 83 and the control gate electrode layer 5 as in usual cases. Accordingly, the data possessing characteristic can be improved.

In this example, a non-volatile semiconductor memory of EEPROM is used but it is applicable also to CCD or the like.

According to the present invention, protrusions on the surface of the floating gate electrode layer can be eliminated by the polishing to the surface as described above. Therefore, partial reduction of the thickness of the oxide film in the second gate insulator film can be avoided and, as a result, when a working voltage is applied to the non-volatile memory device, there is no worry that electrons are drawn out from the floating gate electrode by the electric field to lower the data possessing characteristic.

That is, when the device is stored for a long period of time after initial writing, the number of electrons emitted by heat energy from the floating gate electrode can be reduced to improve the data possessing characteristic. Therefore, the threshold value of the memory transistor can be maintained at a high level.

What is claimed is:

1. A method of manufacturing a SOI substrate forming a thin film of a silicon layer on an insulator substrate by bonding a substrate, wherein the method comprises successively:
    forming an etching stopping layer on the surface of a silicon substrate,
    forming an epitaxially grown polycrystalline silicon layer having a rectangular step on said etching stopping layer,
    bonding said silicon substrate formed with said silicon layer with another substrate as the insulator substrate,
    grinding said silicon substrate from the rear face to such an extent as not to expose said etching stopping layer, and etching it using a solution of ethylene diamine and pyrocatechol till said etching stopping layer is exposed and removing said etching stopping layer.

2. A method of forming a SOI substrate comprising the steps of forming an insulator layer on one surface of a first silicon substrate, bonding a second substrate to said first silicon substrate formed with said insulator layer, and polishing the other surface of said first silicon substrate, thereby obtaining a SOI structure in which a silicon portion is present on an insulator portion, wherein the method comprises:
    patterning one of the surfaces of silicon substrate with a surface relief pattern and forming said insulator portion thereon,
    forming a first conduction portion at a first position on said insulator portion,
    forming a connection hole through said insulating layer at a second position and forming a filled connection portion filing said correction hole,
    forming a groove in said connection portion to form a trench portion,
    bonding another substrate subsequently,
    polishing said other surface of said first silicon substrate to form said silicon portion and then
    forming a second conduction portion at said first and second positions.

3. A method of forming a SOI substrate comprising the steps of forming a insulator layer on one surface of a first silicon substrate, bonding a second substrate to said first silicon substrate formed with said insulator layer and polishing the other surface of said first silicon substrate, thereby obtaining a SOI structure in which a silicon portion is present on an insulator portion, wherein the method comprises:
    patterning said one of said first silicon substrate with a surface relief pattern to form said insulator portion thereon,
    forming an opening at a first position in said insulator portion,
    forming a connection hole through said insulation portion at a second position,
    filling said opening to form a first conduction portion and filling said connection hole to form a connection portion,
    forming a groove in said connection portion to form a trench portion,
    bonding a said second substrate subsequently,
    polishing the other surface of said first silicon substrate to form said silicon portion and then
    forming a conduction portion at said first and second positions.

4. The method according to claim 2 wherein said step of forming a first conduction pattern, and said step of forming a filled connected portion are formed simultaneously by forming a polycrystalline silicon layer with simultaneously forming said first connection portion and forming an electrode of a capacitor formed in said trench portion.

5. The method according to claim 2 including the step of forming an insulating layer on said silicon portion, before forming said conduction portion at said first and second positions, to define a double gate FET, in which said silicon portion forms a channel of said FET, said first conduction portion forms one gate of said FET, and said second conduction portion forms the second gate of said FET.

6. The method according to claim 5 including the step of using said insulating layer as a stop during the polishing of said other surface of said first silicon substrate, in order to obtain a uniform thin silicon portion.

7. The method according to either of claims 2 and 3 including the step of forming a DRAM using said silicon portion.

8. The method according to either of claims 2 and 3 including the step of form a CCD device using said silicon portion.

9. The method according to either of claims 2 and 3 including the step of forming a gate array device, using said silicon portion.

* * * * *